United States Patent
Wang et al.

(10) Patent No.: US 10,372,867 B2
(45) Date of Patent: Aug. 6, 2019

(54) IN-DESIGN REAL-TIME ELECTRICAL IMPACT VERIFICATION FLOW

(71) Applicant: Synopsys, Inc., Mountain VIew, CA (US)

(72) Inventors: Jun Wang, Shanghai (CN); Randy Bishop, Pleasanton, CA (US); Jingyu Xu, Beijing (CN); Dick Liu, Saratoga, CA (US); Hu Cai, Shanghai (CN); Jun Lu, Beijing (CN)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/843,982

(22) Filed: Sep. 2, 2015

(65) Prior Publication Data

US 2017/0061064 A1 Mar. 2, 2017
US 2017/0249415 A9 Aug. 31, 2017

Related U.S. Application Data

(60) Provisional application No. 62/044,861, filed on Sep. 2, 2014.

(51) Int. Cl.
*G06F 17/50* (2006.01)
*G06F 9/455* (2018.01)

(52) U.S. Cl.
CPC ...... *G06F 17/5081* (2013.01); *G06F 17/5077* (2013.01)

(58) Field of Classification Search
USPC ......... 716/106, 108, 109, 111, 113, 133, 134
See application file for complete search history.

(56) References Cited

U.S. PATENT DOCUMENTS

| | | | | | |
|---|---|---|---|---|---|
| 6,080,201 | A | * | 6/2000 | Hojat | G06F 17/5068 703/14 |
| 8,195,439 | B1 | * | 6/2012 | Hussain | G06F 17/5036 703/14 |
| 2003/0014201 | A1 | * | 1/2003 | Schultz | G06F 17/5036 702/64 |
| 2003/0101399 | A1 | * | 5/2003 | Yoshikawa | G06F 17/505 714/744 |
| 2005/0108667 | A1 | * | 5/2005 | Iadanza | G06F 17/5045 716/104 |
| 2009/0326873 | A1 | * | 12/2009 | Wang | G06F 17/505 703/1 |
| 2013/0091483 | A1 | * | 4/2013 | Chen | G06F 17/5045 716/134 |
| 2013/0290916 | A1 | * | 10/2013 | Lee | G06F 17/5036 716/102 |
| 2014/0173537 | A1 | * | 6/2014 | Mohanty | G06F 17/5063 716/103 |

(Continued)

*Primary Examiner* — Brian Ngo (74) *Attorney, Agent, or Firm* — Alston & Bird LLP (57) ABSTRACT

Techniques for analyzing a routed interconnection of a net of a circuit are discussed herein. Some embodiments may include a method comprising with a computer, analyzing the circuit to determine a performance parameter of the net, wherein the circuit is analyzed based at least in part on applying pre-layout simulation data of the net to layout data of the circuit. Additionally or alternatively, the circuit may be analyzed based on extracting characteristics of the routed interconnection from the layout data of the net.

16 Claims, 5 Drawing Sheets

(56) References Cited

U.S. PATENT DOCUMENTS

| | | | |
|---|---|---|---|
| 2014/0282308 A1* | 9/2014 | Chen | G06F 17/5045 716/102 |
| 2015/0143314 A1* | 5/2015 | Chen | G06F 17/5081 716/112 |
| 2015/0154333 A1* | 6/2015 | Chai | G06F 17/5081 716/112 |
| 2015/0269305 A1* | 9/2015 | Chen | G06F 17/5081 716/112 |

* cited by examiner

IN-DESIGN REAL-TIME ELECTRICAL IMPACT VERIFICATION FLOW

CROSS-REFERENCE TO RELATED APPLICATIONS

The application claims the benefit of U.S. Provisional Patent Application No. 62/044,861, titled "In-Depth Real-Time Electrical Impact Verification Flow," filed Sep. 2, 2014, which is incorporated herein by reference in its entirety.

FIELD

The present invention relates, generally, to electronic design automation (EDA), and more particularly, to routing designs for circuit performance.

BACKGROUND OF THE INVENTION

With the advance of semiconductor technology, impact of interconnection routing on performance parameters such as electro-migration (EM), parasitic resistances and capacitors (parasitic RC), and voltage drop (IR drop), become more and more severe in advanced node, such as 14 nm and 10 nm nodes, IC designs. It takes designers an undesirable amount of design time in verification and fixing.

Figure 1:
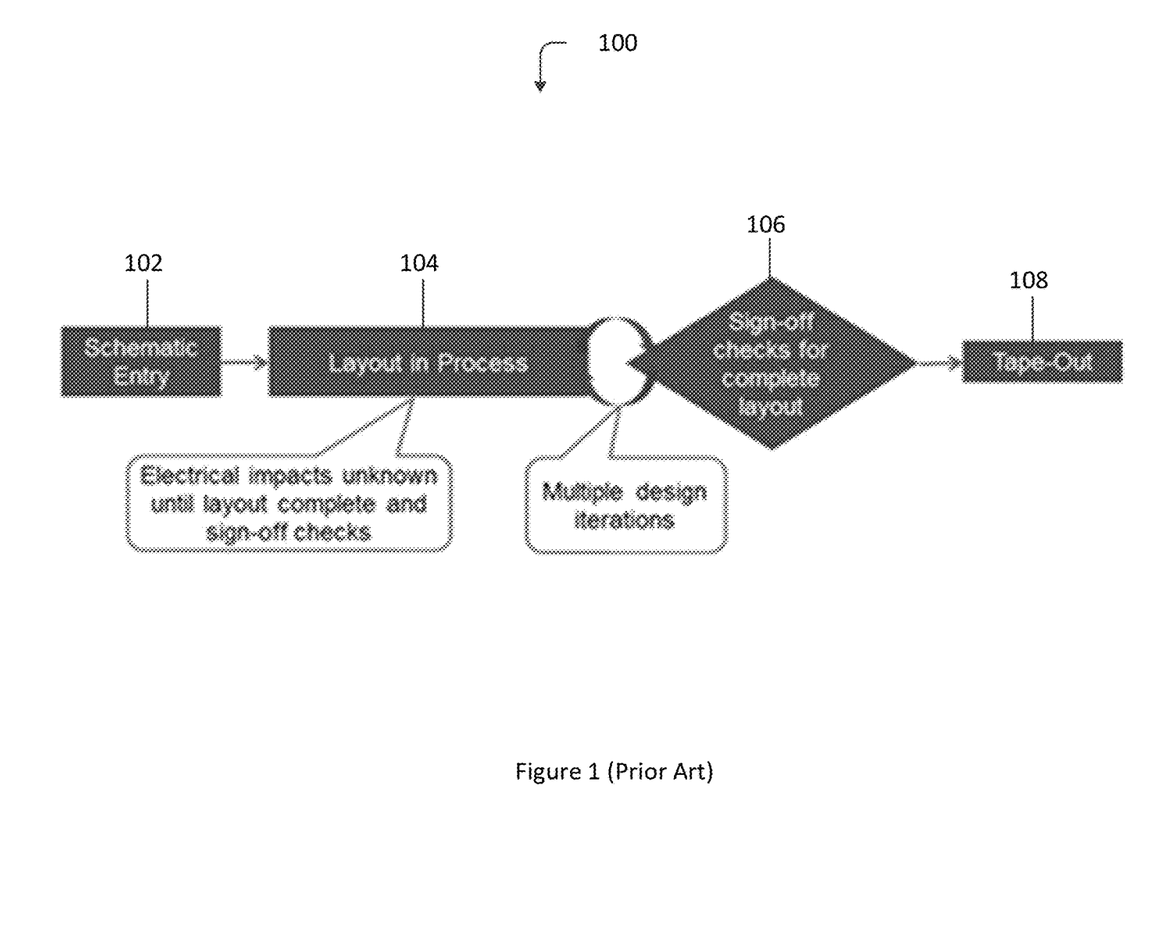
FIG. 1 is a simplified design flow of an IC, as known in the prior art.

FIG. 1 is a simplified conventional design flow 100 of an IC. At 102 the design schematic is entered and simulations are performed. At 104 the design layout is formed. After multiple iterations and following the completion of the layout and sign-off at 106, the design is taped out at 108. During the layout phase 104, the impact of various electrical parameters are unknown to designers until the layout is finished and passed into sign-off checks. But it is often too difficult at such a late stage to fix the electrical impacts. Designers might need to re-design the layout from very beginning and they may need several such iterations to make a design clean of errors. This leads to a long turn-around-time. A need for an efficient and user-friendly verification flow to prevent the electrical-impact verifications from being the bottle-neck of layout designs continues to exist.

SUMMARY OF THE INVENTION

One inventive aspect is a computerized method of analyzing a routed interconnection of a net of a circuit. The method includes, with the computer, simulating the net to determine a performance parameter of the net. The net is simulated using electrical parameters from the routed interconnection, and the net is simulated using, as input, profile results of another simulation of the net not using the electrical parameters from the routed interconnection.

BRIEF DESCRIPTION OF THE DRAWINGS

The accompanying drawings, which are incorporated in and constitute a part of this specification, illustrate implementations of inventive concepts and, together with the description, serve to explain various advantages and principles of the invention.

DETAILED DESCRIPTION OF THE INVENTION

For the purposes of explanation, the ensuing details are set forth in order to provide a thorough understanding of various embodiments. It will be apparent, however, to one skilled in the art that various embodiments may be practiced without some of these specific details. For example, circuits, systems, networks, processes, and other components may be shown as components in block diagram form in order not to obscure the embodiments in unnecessary detail. In other instances, known circuits, processes, algorithms, structures, and techniques may be shown without unnecessary detail in order to avoid obscuring the embodiments. In other instances, well-known structures and devices are shown in block diagram form.

Embodiments provided herein are examples only, and are will not intended to limit the scope, applicability, or configuration of the disclosure. Rather, the ensuing description of the embodiments will provide those skilled in the art with an enabling description for implementing one or more embodiments. It should be understood that various changes may be made in the function and arrangement of elements without departing from the spirit and scope of the disclosed systems and methods as set forth in the appended claims.

Also, individual embodiments may, for example, be described as one or more processes which are depicted as flowcharts, flow diagrams, data flow diagrams, structured diagrams, or block diagrams. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine-readable medium. A processor(s) may perform the necessary tasks.

Figure 2:
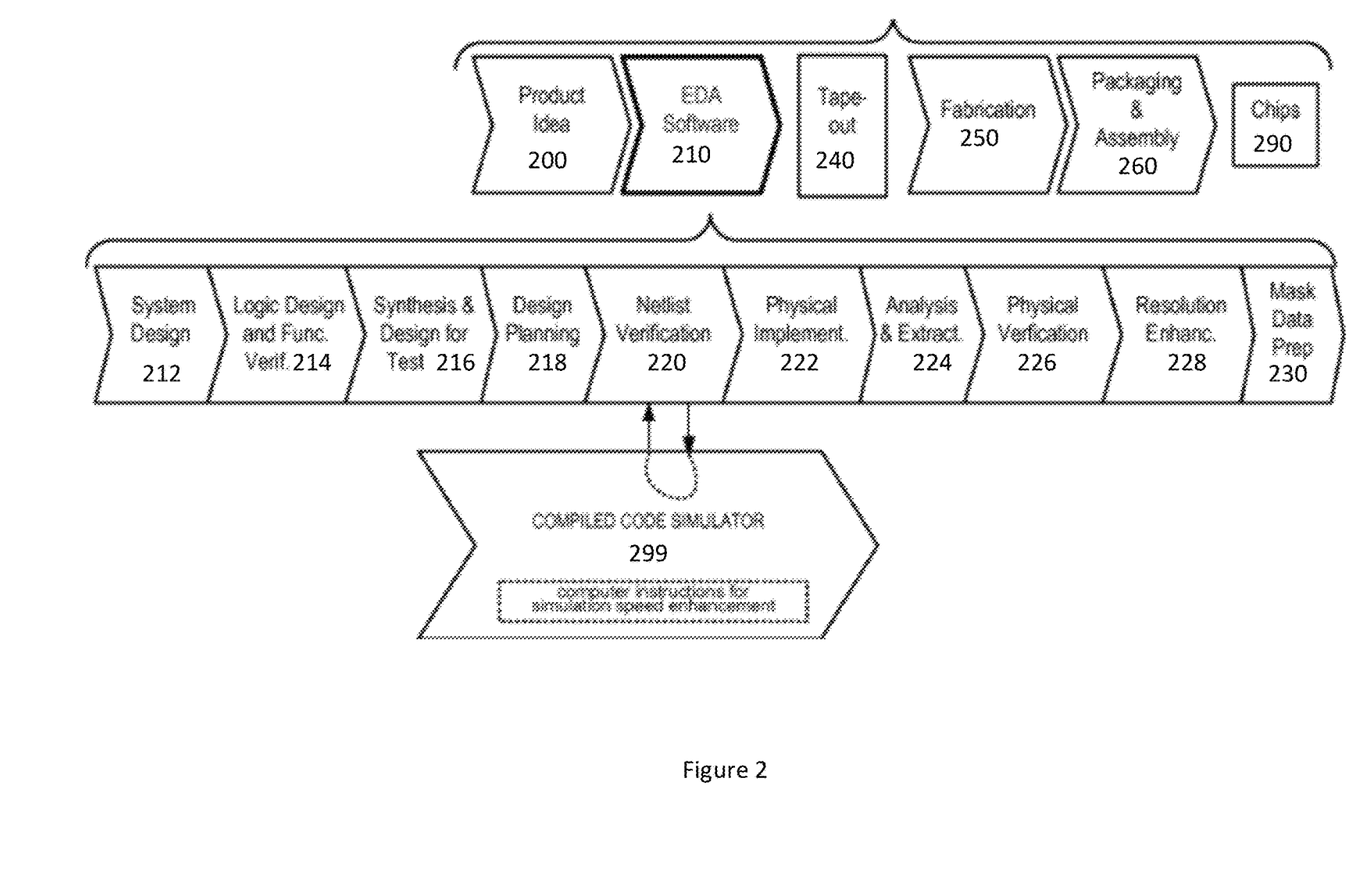
FIG. 2 illustrates a simplified representation of the design flow of an exemplary IC (ASIC), in accordance with some embodiments of the present invention.

Any appropriately programmed computer (hereinafter "compiled code simulator") may automatically perform steps discussed herein, and may be used in an analog design flow, or in a digital design flow, such as that illustrated in FIG. 2 in a simplified exemplary representation. At a high level, the process of designing a chip starts with the product idea 200 and is realized in an EDA software design process 210. When the design is finalized, it can be taped-out at 240. After tape out, fabrication process 250 and packaging and assembly occur at 260 resulting, ultimately, in finished chip 290.

The EDA software design process 210 includes a number of stages 212-230, shown in linear fashion for simplicity. In an actual ASIC design process, the particular design might have to go back through steps until certain tests are passed.

Similarly, in any actual design process, these steps may occur in different orders and combinations. This description is therefore provided by way of context and general explanation rather than as a specific, or recommended, design flow for a particular ASIC. A brief description of the components of the EDA software design process of 210 is provided below.

System design 212: The circuit designers describe the functionality that they want to implement, they can perform what-if planning to refine functionality, check costs, etc. Hardware-software architecture partitioning can occur at this stage. Exemplary EDA software products from Synopsys®, Inc. that can be used at this stage include Model Architect, Saber, System Studio, and DesignWare® products.

Logic design and functional verification 214: At this stage, the VHDL or Verilog code for modules in the system is written and the design (which may be of mixed clock domains) is checked for functional accuracy. Exemplary EDA software products from Synopsys®, Inc. that can be used at this stage include VCS, VERA, DesignWare®, Magellan, Formality, ESP and LEDA products.

Synthesis and design for test 216: At this stage, the VHDL/Verilog is translated to a netlist. The netlist can be optimized for the target technology. Additionally, the design and implementation of tests to permit checking of the finished chip occurs. Exemplary EDA software products from Synopsys®, Inc. that can be used at this stage include Design Compiler®, Physical Compiler, Test Compiler, Power Compiler, FPGA Compiler, Tetramax, and DesignWare® products.

Design planning 218: At this stage, an overall floorplan for the chip is constructed and analyzed for timing and top-level routing. Exemplary EDA software products from Synopsys®, Inc. that can be used at this stage include Jupiter and Floorplan Compiler products.

Netlist verification 220: At this stage, the netlist is checked for compliance with timing constraints and for correspondence with the VHDL/Verilog source code. Exemplary EDA software products from Synopsys®, Inc. that can be used at this stage include VCS, VERA, Formality and PrimeTime products.

Note that a compiled code simulator 299 can be used during this stage 220. If the displayed results are not satisfactory, a chip designer may go back to 216 to make changes to the IC design.

Physical implementation 222: The placement (positioning of circuit elements, such as the above-described sequential cells and combinational cells) and routing (connection of the same) occurs at this step. Exemplary EDA software products from Synopsys®, Inc. that can be used at this stage include the Astro product. Although circuitry and portions thereof (such as rectangles) may be thought of at this stage as if they exist in the real world, it is to be understood that at this stage only a layout exists in a computer 150. The actual circuitry is created after this stage as described further below.

Analysis and extraction 224: At this step, the circuit function is verified at a transistor level, this in turn permits what-if refinement. Exemplary EDA software products from Synopsys®, Inc. that can be used include Star RC/XT, Raphael, and Aurora products.

Physical verification 226: At this stage various checking functions are performed to ensure correctness for: manufacturing, electrical issues, lithographic issues, and circuitry. Exemplary EDA software products from Synopsys®, Inc. that can be used at this stage include the Hercules product.

Resolution enhancement 228: This involves geometric manipulations of the layout to improve manufacturability of the design. Exemplary EDA software products from Synopsys®, Inc. that can be used at this include iN-Phase, Proteus, and AFGen products.

Mask data preparation 230: This provides the "tape-out" data for production of masks for lithographic use to produce finished chips. Exemplary EDA software products from Synopsys®, Inc. that can be used include the CATS® family of products. Actual circuitry in the real world is created after this stage, in a wafer fabrication facility (also called "fab").

The data structures and software code for implementing one or more acts described in this detailed description can be encoded into a computer-readable medium, which may be any storage medium and/or any transmission medium that can hold code and/or data for use by a computer. Storage medium includes, but is not limited to, magnetic and optical storage devices such as disk drives, magnetic tape, CDs (compact discs), and DVDs (digital versatile discs). Transmission medium (with or without a carrier wave upon which the signals are modulated) includes but is not limited to a wired or wireless communications network, such as the Internet. In one embodiment, the transmission medium uses a carrier wave that includes computer instruction signals for carrying out one or more steps performed by the methods discussed herein. Another embodiment uses a carrier wave that includes instructions to perform a method as discussed herein.

A computer system used in some embodiments to implement a simulation speed enhancer of the type described herein uses one or more Linux® operating system workstations (based on IBM®-compatible PCs) and/or Unix® operating systems workstations (e.g. SUN Ultrasparc, HP PA-RISC, or equivalent), each containing a 2 GHz CPU and 1 GB memory, that are interconnected via a local area network (Ethernet).

Electro-migration (EM) is the movement of material that results from the transfer of momentum between electrons and metal atoms under an applied electric field. This momentum transfer causes the metal atoms to be displaced from their original positions. The displacement results in increased resistance of interconnections. This effect becomes more severe at higher temperatures. Thus, in advanced process designs, with higher device currents, narrower wires, and increasing on-die temperatures, the reliability of interconnections and their possible degradation from EM is a serious concern.

In accordance with some embodiments, an in-design electrical impacts reporter provides information so that the layout design can be verified and electrical issues corrected earlier in the design cycle. Electrical impacts of a layout interconnection depend not only on the layout interconnection itself, but also on its circuit operating conditions and global layout parameters. Parasitic RC of an interconnection depends not only on the layout of the interconnection itself, but also on the layout of the whole design. For a real-time in-design reporter, however, layout of the whole design is not finished yet, therefore, parasitic RC cannot be extracted from the whole design layout in a real-time manner. Furthermore, electrical impacts also depend on circuit operating conditions, such as operating currents and bias voltages. Such data, however, is not available directly from the layout information. Furthermore, because the circuit operating conditions vary with time, the circuit operating conditions cannot be simply represented by a single value.

As is described further below, in accordance with one embodiment of the present invention, by coupling the front-end schematic simulation at the front-end to the layout design at back-end, potentially problematic layout problems are detected early to generate solutions. The front-end simulation data, including current and voltage waveforms, are mapped into the back-end design. A back-end real-time electrical impacts reporter takes the front-end information, the layout information, and the global layout parameters, and predicts electrical impacts.

Figure 3:
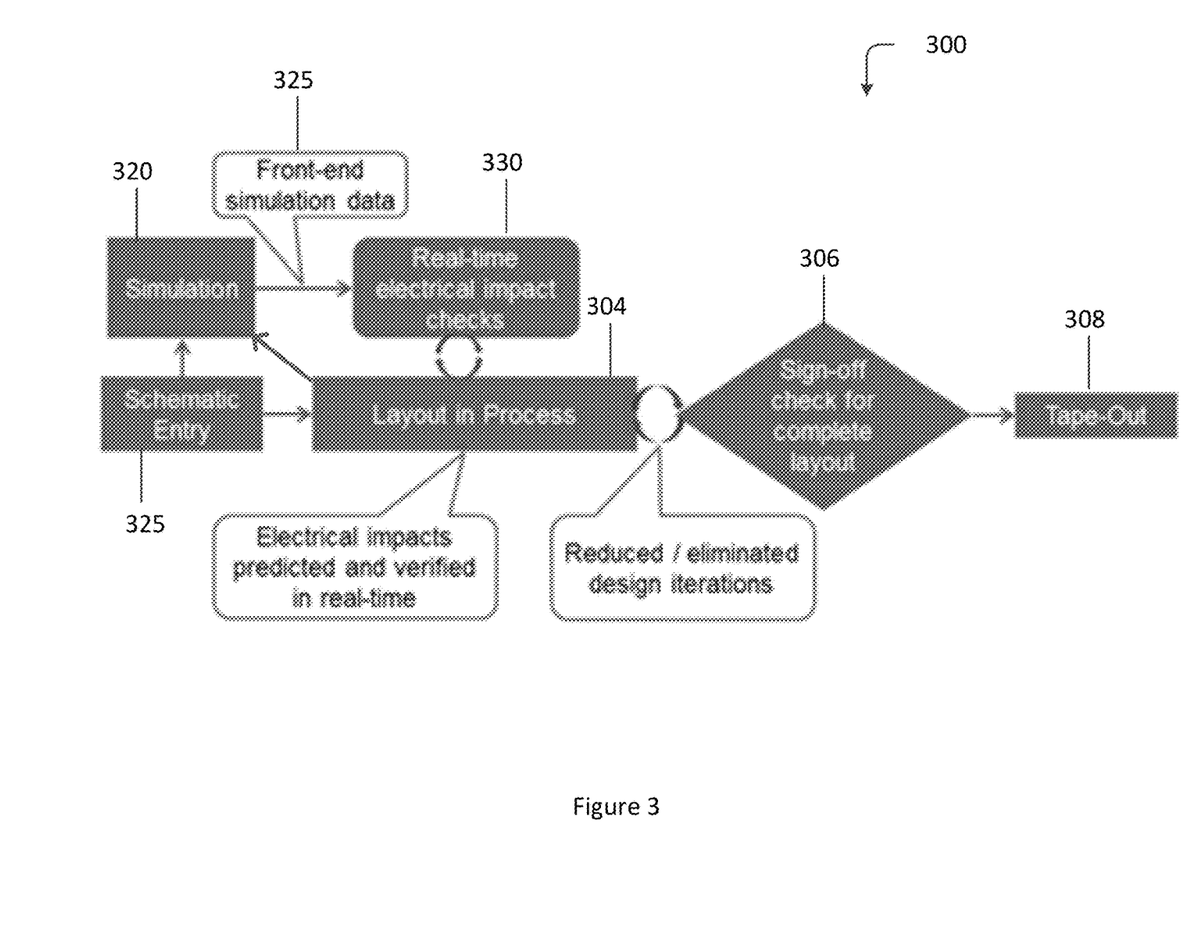
FIG. 3 illustrates a conventional design flow of an IC.

FIG. 3 illustrates a design flow 300 of an IC, in accordance with some embodiments of the present invention. At 302 the design schematic is captured. Using the captured schematic, at 320 design simulations are performed, and at 304 a layout of the design is formed. The front-end simulation data 325, including current and voltage waveforms, as described further below, is made available to perform a real-time electrical impact check 330 of layout formation 304 to enable determination of the impact of the electrical parameters associated with the layout in real time.

Furthermore, the real-time electrical impact check 330 may receive information from the layout formation 304 to compare, for example, the current flow through various interconnections of the layout against threshold values defined by design rules. For example, spacing and density information is extracted from the layout in regions for which the layout is defined or finished. In another example, for regions which layout has not been finished, spacing and density parameters may, for example, be estimated according to a worst-case scenario (maximum density, minimum spacing) or according to target layout constraints, such as a target density specified by users to avoid over-estimations of parasitic parameters. The layout is then modified to ensure no design rules, spacing or current density threshold values are violated. The parasitics and any other parameters affecting performance are then extracted from the modified layout and used to perform additional simulations, which in turn results in further checking by impact checker 330 and additional layout modifications in an iterative manner until the circuit simulation objectives are met and all design, spacing, density, and the like, rules and threshold values are satisfied.

In various embodiments, one or more of the front-end simulation data 325 and the parasitic resistances and capacitors of interconnections may be used to estimate the impact of the electrical parameters in real time. By estimating the impact of the electrical parameters in real time, the layout formation 304 is modified early in the layout phase, thereby decreasing the possibility of electrical errors, lowering the number of design cycles and reducing the turnaround time. At 306 the layout is completed and the sign-off is performed. At 308, the tape out is performed.

In some embodiments, the layout formation 304 (e.g., as modified by the real-time electrical impact checks 330) may be applied to a subsequent simulation 320. Similarly, the results of the subsequent simulation 320 may be fed back to the real-time electrical impact checks 330, which may then be used to estimate the impact of the electrical parameters, and the modifying the layout formation 304 based on the impact of the electrical parameters, and so forth. In that sense, the steps of design flow 300 may be repeated, such as until the layout is completed.

As described above, in accordance with some embodiments, estimates of the global layout parameters for parasitic RC extractions are provided according to the target constraints of circuit layout, so that parasitic RC of an interconnection can be estimated in a real-time manner in design according to the layout and the estimated global layout parameters. For each sub-circuit or net, the front-end pre-layout schematic simulation data is mapped into to an associated back-end layout for the circuit operating conditions. Although an accurate current and voltage of an interconnection may be simulated in the sign-off stage after all layout is finished, the front-end schematic simulation data for each device and sub-circuit port can be used as inputs to estimate current and voltage of interconnections in the sub-circuit.

Accordingly, embodiments of the present invention achieve a high reporting accuracy of the electrical impacts for each interconnection by using driving profiles of current and voltages and global layout parameters. Furthermore, by obtaining electrical operating conditions from pre-layout front-end simulation instead of post-layout sign-off simulation, embodiments of the present invention enable accurate in-design and real-time reporting of electrical impacts.

As is well known, an IR drop is a voltage drop across an interconnect caused by the resistance of the interconnect, as represented by Ohm's law, V=IR.

Any of the currents $I_{avg}$, $I_{rms}$ and $I_{peak}$ may be used, for example, in connection with the EM and IR drop analysis, for simulation purposes. $I_{avg}$ represents the average or DC value of a current, relates to the EM material movement effect directly, and affects the time-to-failure (TTF) of a circuit. Inns represents the root-mean-square of a current, relates to power consumptions and the corresponding temperature of a circuit, and affects TTF because the EM material movement effect becomes more severe at higher temperatures. $I_{peak}$ represents the maximum current at which a metal line undergoes excessive heating and can begin to melt. $I_{peak}$ relates to both periodic-AC/pulsed-DC signals and single-event high current pulse such as ESD.

Currents $I_{avg}$, $I_{rms}$, and/or $I_{peak}$, or estimates thereof may be used to generate EM and IR drop estimates for every interconnection and node in the design. The EM and IR drop estimates may be compared against respective EM and IR drop limits. EM and IR drop may be estimated, for example, using any of the following techniques described below.

In static analysis, EM and IR drop for every wire and node in a net may be determined based on a fixed (e.g. average) current, as determined in a front-end simulation (to generate "pre-layout simulation data," as used herein), for each of the net terminals. The DC component of the currents at the net terminals may be used for determining the average current of the wires and nodes of the net. If $I_{rms}$ and $I_{peak}$ values of the wires and nodes of the net are determined based on fixed $I_{rms}$ and $I_{peak}$ currents from simulation for each of the net terminals, static analysis can lead to over-pessimistic analysis results.

In a dynamic analysis, pre-layout simulation data such as profiles of each terminal current, instead of a single average current for each terminal, are used to calculate $I_{rms}$ and $I_{peak}$. Given profiles of the currents, EM and IR drop for each interconnection and node may be accurately determined. The profiles may be determined for any domain, for example, the profiles may be over a time domain, a frequency domain, an s domain, or over one or more other domains.

Figure 4:
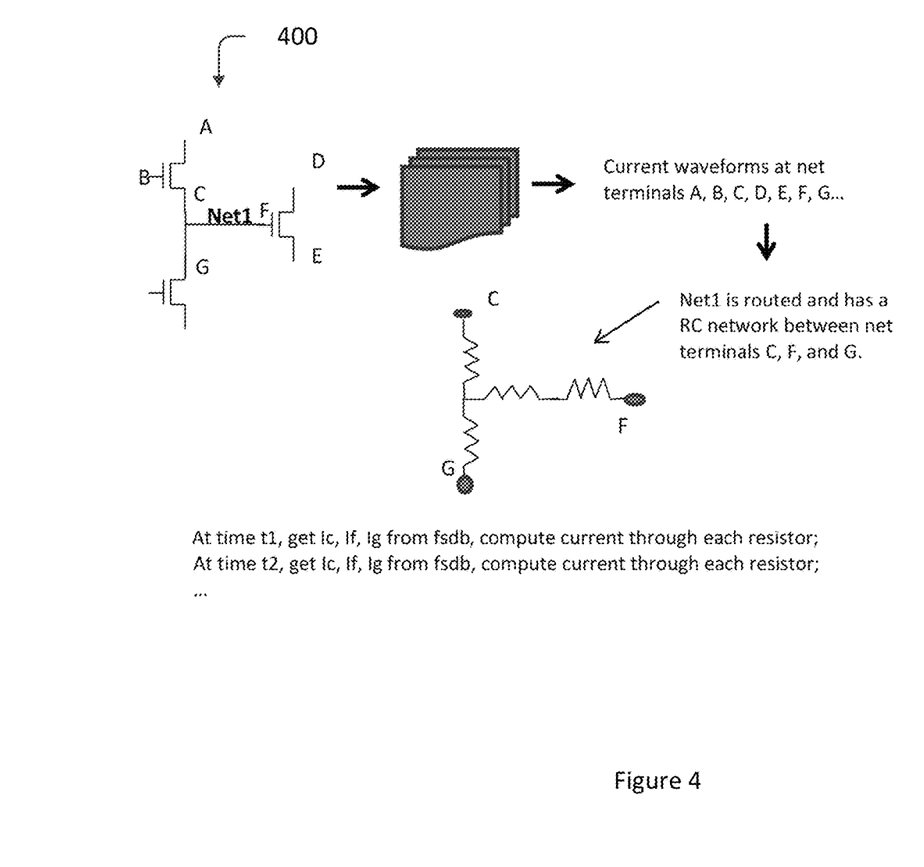
FIG. 4 illustrates an improved design flow of an IC, in accordance with some embodiments.

FIG. 4 illustrates an exemplary dynamic analysis of a sub-circuit 400 having net Net1, in accordance with some embodiments. For example, $I_{avg}$, $I_{peak}$, and $I_{rms}$ may be calculated as follows. From waveforms (e.g. current, voltage, etc.) of terminals of the net, as defined in simulation results, such as an .fsdb file, a circuit solver calculates the corresponding current waveform of each and every connection object (wires and vias) of the net.

Thereafter for every wire and via, $I_{avg}$, $I_{peak}$, and $I_{rms}$ are calculated, for example, by using the equations below:

$$I_{avg}=[(\int_0^\tau I(t)dt)/\tau] \text{ or } [(\int_0^\tau |I(t)|dt)/\tau]$$

$$I_{peak}=\max(|I(t)|)$$

$$I_{rms}=\sqrt{[(\int_0^\tau I(t)^2 dt)/\tau]}$$

where $\tau$ is the period of a pulsed DC or AC current. Other equations may be used to determine $I_{avg}$, $I_{peak}$, and $I_{rms}$. In addition, other current values may be used to determine EM and IR drop.

The trade-off between static and dynamic analysis is a trade-off between speed and accuracy. The static approach performs only a DC analysis of the circuit so has the shortest time for reporting, and the dynamic approach does a transient analysis, and therefore requires a longer time to finish a reporting. However, if $I_{rms}$ and $I_{peak}$ reporting are used, the dynamic analysis provides a more accurate analysis. Furthermore, by selecting sampling points carefully, the time for a dynamic analysis can be similar to that of a static analysis.

There are several methods of acquiring profiles of a current. They can be characterized by a pattern and modeled by several parameters for regular currents, such as digital signals. They can also be fully described by a waveform in pre-layout simulations, such as in a .fsdb file from analog circuit simulations.

Parasitic resistances and capacitors of an interconnection may, for example, be determined based on one or more of the following:

1. Interconnection geometry: width and length of the interconnection,
2. Local neighbors: spacing to neighboring interconnections and structures,
3. Global layout: density of a region around the interconnection. The size of the region may be determined by the semiconductor fabrication process.

In a region for which layout has been finished, spacing and density information is extracted from the layout (or "layout data") directly. For other regions, for which layout has not been finished, spacing and density parameters may, for example, be estimated according to a worst-case scenario (maximum density, minimum spacing) or according to target layout constraints, such as a target density specified by users to avoid over-estimations of parasitic parameters. In some embodiments, the user can select from a number of spacing and density parameter options. For example, the user may provide an indication to use worst case estimation, or the user may provide values, for example, of density and spacing.

Figure 5:
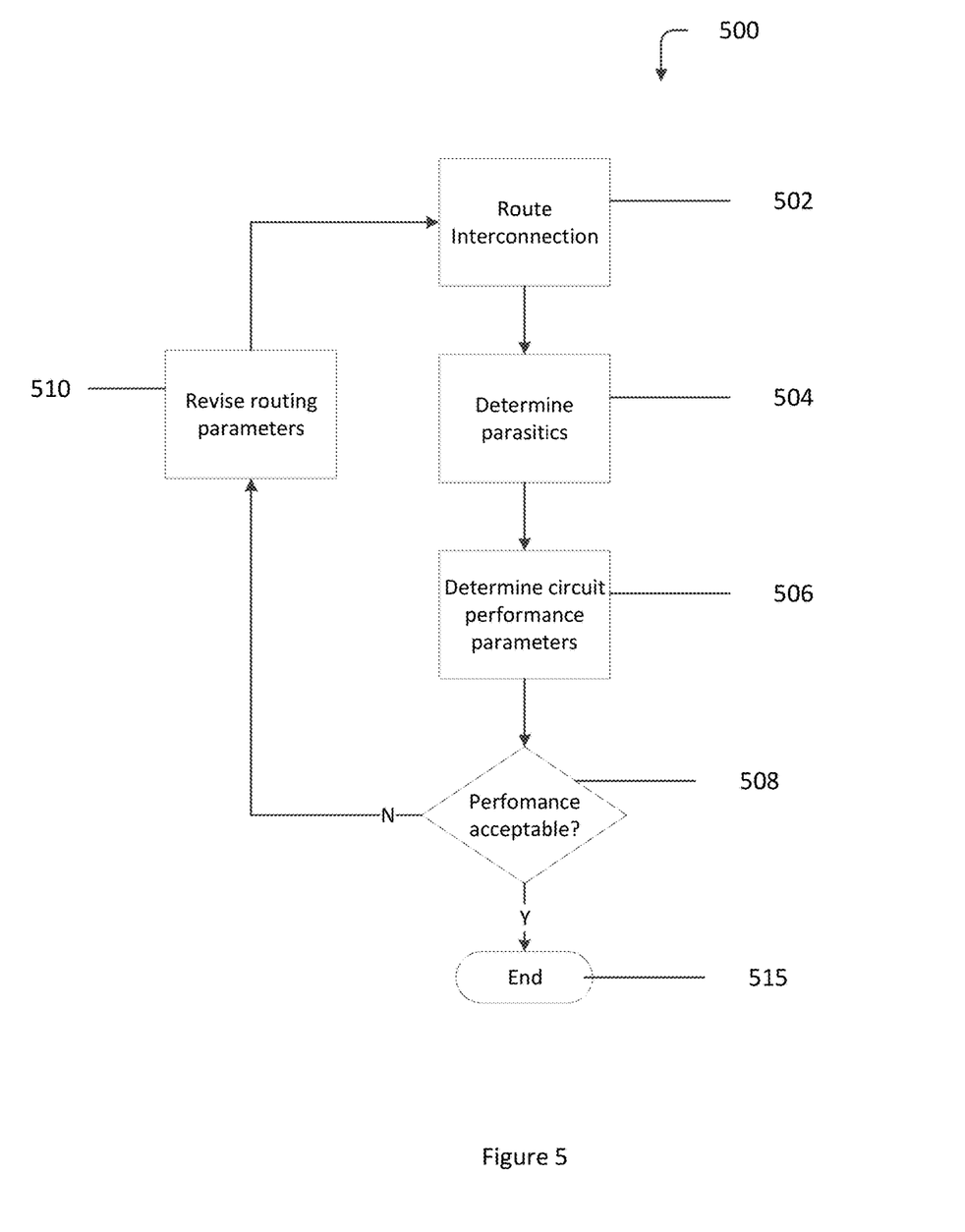
FIG. 5 illustrates an exemplary dynamic analysis of a sub-circuit or net ("Net1"), in accordance with some embodiments.

FIG. 5 is a flowchart 500 for routing interconnections of the nets of a circuit, in accordance with one embodiment of the present invention. At 502, an interconnection of a net is routed according to schematic and routing parameters provide thereto. In some embodiments, the interconnection is routed automatically by a router. In some embodiments, the interconnection is routed manually, for example, by a layout designer.

At 504 parasitic information for the routed interconnection are determined. Parasitic information, for example, may include one or more of parasitic resistance, capacitance, and inductance. Parasitic information, for example, may be determined using any methods known in the art or developed in the future. In some embodiments, the parasitic information is determined automatically, for example, as part of a routing function in an automated system. In some embodiments, the parasitic information is determined in response to input from a user identifying the routed interconnection.

At 506, one or more current or voltage values are calculated for the physical structures (e.g. wires, vias, etc.) of the routed interconnection. The current values, for example, may include one or more of $I_{avg}$, $I_{rms}$, and $I_{peak}$. The current or voltage values, for example, may be determined using methods described elsewhere herein, or may be determined using any methods known in the art or developed in the future. In some embodiments, the values are calculated automatically, for example, as part of a routing function in an automated system. In some embodiments, the values are calculated in response to input from a user identifying the routed interconnection.

At 508, the calculated current or voltage values are compared with limits to determine whether the routing of the routed interconnection is acceptable. If the routing of the routed interconnection is not acceptable, at 510, the routing parameters for rerouting the interconnection are modified. For example, a width parameter for routing the interconnection may be increased, and/or a length parameter may be decreased. Other parameters may be modified. Once the routing parameters are modified, the interconnection routing returns to 502 to reroute the interconnection. In some embodiments, the interconnection is rerouted automatically, for example, as part of a routing function in an automated system. In some embodiments, the interconnection is rerouted manually, for example, by a layout designer. Once the interconnection routing is acceptable, it ends at 515. Once the interconnection is acceptably routed, a next interconnection of the circuit may be routed, for example using flowchart 500.

The above embodiments of the present invention are illustrative and not limitative. Other modifications and variations will be apparent to those skilled in the art and are intended to fall within the scope of the appended claims.

What is claimed is:

1. A computer-implemented method of generating a layout of an integrated circuit design, the method comprising:
    performing, using a processor, a pre-layout simulation of the integrated circuit design to generate simulation data;
    extracting, using the processor, characteristics of a plurality of routed interconnections based on layout data of the circuit, wherein the layout data comprises extracted spacing and density information of those regions of the circuit for which layout has been finished and estimated spacing and density information of those regions of the circuit for which layout has not yet been finished;
    using the simulation data and the extracted characteristics of routed interconnections, calculating, using the processor, an electro-migration (EM) and IR drop for each routed interconnection of the plurality of interconnections; and
    creating, using the processor, a modified layout of the integrated circuit by changing, using the processor, the layout of the integrated circuit in accordance with electro-migration (EM) and IR drop limits.

2. The method of claim 1, wherein the pre-layout simulation data comprise profiles of current or voltages of a plurality of nets of the integrated circuit.

3. The method of claim 2, wherein the profiles of current or voltages are over at least one of the time domain or the frequency domain.

4. The method of claim 1, wherein the pre-layout simulation data comprises static current values.

5. The method of claim 1, wherein the simulation data comprises a value of one or more currents of at least one routed interconnection.

6. The method of claim 5, wherein the value is one of an average current, an rms current, or a peak current.

7. The method of claim 1, wherein the simulation data comprises a value of a voltage drop of the at least one routed interconnection.

8. The method of claim 1 further comprising:
automatically rerouting, using the processor, the routed interconnections in accordance with the electro-migration (EM) and IR drop limits, wherein routing parameters for rerouting the routed interconnections are modified prior to rerouting.

9. A system for generating a layout of an integrated circuit design, the system configured to:
perform a pre-layout simulation of the integrated circuit design to generate simulation data;
extract characteristics of routed interconnections based on layout data of the circuit, wherein the layout data comprises extracted spacing and density information of those regions of the circuit for which layout has been finished and estimated spacing and density information of those regions of the circuit for which layout has not yet been finished;
using the simulation data and the extracted characteristics, calculate an electro-migration (EM) and IR drop for each routed interconnection; and
create a modified layout of the integrated circuit by changing the layout of the integrated circuit in accordance with electro-migration (EM) and IR drop limits.

10. The system of claim 9, wherein the pre-layout simulation data comprises profiles of current or voltages of a plurality of nets of the integrated circuit design.

11. The system of claim 10, wherein the profiles of current or voltages are over at least one of the time domain or the frequency domain.

12. The system of claim 11, wherein the pre-layout simulation data comprises static current values.

13. The system of claim 11, wherein the data comprises a value of one or more currents of at least one routed interconnection.

14. The system of claim 13, wherein the value is one of an average current, an rms current, or a peak current.

15. The system of claim 9, wherein the simulation data comprises a value of a voltage drop of the at least one routed interconnection.

16. The system of claim 9 wherein the system is further configured to:
automatically reroute the routed interconnections in accordance with the electro-migration (EM) and IR drop limits, wherein routing parameters for rerouting the routed interconnections are modified prior to rerouting.

* * * * *